United States Patent
Patil et al.

(10) Patent No.: US 9,698,241 B1
(45) Date of Patent: Jul. 4, 2017

(54) INTEGRATED CIRCUITS WITH REPLACEMENT METAL GATES AND METHODS FOR FABRICATING THE SAME

(71) Applicant: GLOBALFOUNDRIES, Inc., Grand Cayman (KY)

(72) Inventors: Suraj K. Patil, Malta, NY (US); Min-Hwa Chi, San Jose, CA (US); Mitsuhiro Togo, Malta, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 15/071,600

(22) Filed: Mar. 16, 2016

(51) Int. Cl.
*H01L 21/8238* (2006.01)
*H01L 29/66* (2006.01)
*H01L 27/092* (2006.01)
*H01L 29/51* (2006.01)

(52) U.S. Cl.
CPC ............. *H01L 29/66545* (2013.01); *H01L 21/823857* (2013.01); *H01L 27/092* (2013.01); *H01L 29/51* (2013.01)

(58) Field of Classification Search
CPC ........... H01L 21/823857; H01L 27/092; H01L 29/51; H01L 29/66545
See application file for complete search history.

(56) References Cited

U.S. PATENT DOCUMENTS

| | | | |
|---|---|---|---|
| 7,470,577 B2 | 12/2008 | Chambers et al. | |
| 8,283,734 B2 | 10/2012 | Chiang et al. | |
| 2014/0110790 A1 | 4/2014 | Huang et al. | |
| 2017/0032975 A1* | 2/2017 | Tai | H01L 21/32136 |

* cited by examiner

*Primary Examiner* — Thanh V Pham
(74) *Attorney, Agent, or Firm* — Lorenz & Kopf, LLP (57) ABSTRACT

Integrated circuits and methods for fabricating integrated circuits are provided. In one embodiment, a method for fabricating integrated circuits includes forming a gate dielectric overlying a substrate, and forming a base work function layer that includes tungsten overlying the gate dielectric. The base work function layer overlies the gate dielectric in a first and second region, where the first region is one of a pFET region or an nFET region and the second region is the other of the pFET region or the nFET region. A mask is formed over the first region, and then the second region is exposed. A work function value of the base work function layer in the second region is altered to produce a modified work function layer. The mask is removed from the over the first region, and a gate electrode is formed overlying the base and modified work function layers.

16 Claims, 7 Drawing Sheets

INTEGRATED CIRCUITS WITH REPLACEMENT METAL GATES AND METHODS FOR FABRICATING THE SAME

TECHNICAL FIELD

The present disclosure generally relates to integrated circuits and methods for fabricating integrated circuits, and more particularly, relates to integrated circuits having replacement metal gate stacks and methods for fabricating such integrated circuits.

BACKGROUND

As the critical dimensions of integrated circuits continue to shrink, the fabrication of gate electrodes for complementary metal-oxide-semiconductor (CMOS) transistors has advanced to replace silicon dioxide gate dielectrics and polysilicon gate electrodes with high-k dielectric material and electrically conductive materials such as metals, respectively. A replacement metal gate (RMG) process is often used to form the gate electrode. An exemplary replacement metal gate process includes forming a sacrificial gate oxide and a sacrificial polysilicon gate between a pair of spacers on a semiconductor substrate. After further processing steps, such as an annealing process, the sacrificial gate oxide and sacrificial polysilicon gate are removed and the resulting trench is filled with a high-k dielectric and one or more replacement metal layers. The replacement metal layers can include work function materials as well as a metallic gate electrode, which may include aluminum (Al), tungsten (W), and/or other metals.

Processes such as atomic layer deposition (ALD), chemical vapor deposition (CVD), physical vapor deposition (PVD), electroplating (EP), and electroless plating (ELP) may be used to form the one or more replacement metal gate layers that form the replacement metal gate stack. Unfortunately, as critical dimensions decrease, issues such as trench overhang and void formation become more prevalent and pose a greater challenge to overcome. This is due to the smaller gate dimensions. Specifically, at smaller dimensions, the aspect ratio of the trench used to form the replacement metal gate electrode becomes higher as the replacement metal layers form on the trench sidewalls. Metallization of high aspect ratio trenches quite often results in void formation.

Additional issues arise with lateral scaling. For example, lateral scaling presents issues for the formation of contacts. When the contacted gate pitch is reduced to about 64 nanometers (nm), it is difficult to form contacts between the gate lines while maintaining reliable electrical isolation properties between the gate line and the contact. Self-aligned contact (SAC) methodology has been developed to address this problem. Conventional SAC approaches involve recessing the replacement metal gate stack, which includes recessing both work function metal liners and a gate electrode. Work function metal lines may include titanium nitride (TiN), titanium silicon nitride ($TiSi_xN_y$), tantalum nitride (TaN), titanium carbide (TiC), tantalum carbide (TaC), and/or titanium aluminum nitride (TiAlN), and gate electrode materials may include aluminum (Al), tungsten (W), cobalt (Co), copper (Cu) or the like. A dielectric cap may be formed overlying the replacement metal gate stack followed by chemical mechanical planarization (CMP). To set the correct work function for the device, work function layers with varied thicknesses ranging from about 1 to 7 nanometers (nm) are typically used. The work function layers may include a variety of materials, as mentioned above, with a total thickness of more than 5 nm. As gate length continues to scale down, for example for sub-15 nm gates, the replacement metal gate electrode structure is so narrow that it may be "pinched-off" by the work function layers, leaving little or no space remaining for the lower-resistance metallic gate electrode. The reduced space for the gate electrode increases the overall electrical resistance of the replacement metal gate stack. This often results in high resistance issues for devices with small gate lengths, and also causes problems in the SAC replacement metal gate recess process.

Conventional replacement metal gate stacks may suffer from significant threshold voltage variations due in part to variation in the thicknesses of the work function layers. Further, the diffusion of aluminum, oxygen, or fluorine (where fluorine is often used in tungsten deposition processes) into the work function layers and into the high-k gate dielectric can alter the threshold voltage of the replacement metal gate stacks. Conventional processing of titanium nitride and subsequent plasma treatment that can also cause threshold voltage variations of the replacement metal gate stacks. In addition, conventional replacement metal gate for CMOS processes may include the deposition of one work function layer(s) that are appropriate for a p-type field effect transistor ("pFET") and one or more work function layer(s) that are appropriate for an n-type field effect transistor ("nFET"), and this process may involve the removal of the work function layer that is appropriate for one type of FET to prepare for deposition of the work function layer that is appropriate for the other type of FET. The removal steps often cause non-uniformity issues and surface modification in the FET region, which can also result in threshold voltage variation of the replacement metal gate stacks.

Accordingly, it is desirable to provide improved integrated circuits having replacement metal gate stacks and methods for fabricating such improved integrated circuits, particularly as aspect ratios of the replacement metal gate electrodes continue to scale down. Also, it is desirable to provide integrated circuits with replacement metal gate stacks that exhibit low gate electrode resistance and methods for fabricating such integrated circuits. Further, it is desirable to provide integrated circuits with replacement metal gate stacks that exhibit reduced threshold voltage variation and methods for fabricating such integrated circuits. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In one embodiment, a method for fabricating integrated circuits includes forming a gate dielectric overlying a substrate, and forming a base work function layer overlying the gate dielectric where the base work function layer includes tungsten. The base work function layer overlies the gate dielectric in a first and second region, where the first region is one of a pFET region or an nFET region and the second region is the other of the pFET region or the nFET region. A mask is formed over the first region, and then the second region is exposed. A work function value of the base work function layer in the second region is altered to produce a modified work function layer.

The mask is removed from over the first region, and a gate electrode is formed overlying the base and modified work function layers.

In another embodiment, a method for fabricating an integrated circuit includes forming a gate dielectric overlying a substrate that includes a substrate surface. A base work function layer is formed overlying the gate dielectric, and a gate electrode is formed overlying the base work function layer. The gate electrode is about 30 angstroms or less from the substrate surface.

In another embodiment, an integrated circuit is provided. The integrated circuit includes a gate dielectric overlying a substrate. A modified work function layer overlies the substrate, where the modified work function layer includes indium at a concentration of about 20 weight percent or greater and tungsten at a concentration of from about 20 to about 80 weight percent, based on the total weight of the modified work function layer. A gate electrode overlies the modified work function layer.

BRIEF DESCRIPTION OF THE DRAWINGS

Embodiments of integrated circuits and methods for fabricating integrated circuits having replacement metal gate stacks will hereinafter be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits claimed herein. Furthermore, there is no intention to be bound by any expressed or implied theory presented in the preceding technical field, background or brief summary, or in the following detailed description. Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based integrated circuits are well-known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Integrated circuits having replacement metal gate stacks and methods for fabricating such integrated circuits are provided that avoid issues faced by conventional processes for forming replacement metal gate stacks. For example, the methods contemplated herein provide for the formation of integrated circuits with replacement metal gate stacks exhibiting minimized threshold voltage variation within an integrated circuit and between integrated circuits. Also, the methods contemplated herein provide for the formation of integrated circuits with replacement metal gate stacks exhibiting lower overall resistance than conventionally formed replacement metal gate stacks. For example, the methods contemplated herein utilize a common base work function layer across both nFET regions and pFET regions and chemically modify or alter the base work function layer in one of the regions to provide the appropriate work function for both regions in a single layer. As deposited, the base work function layer is appropriate for use in one of the nFET region or the pFET region. In the other region, the work function layer is chemically modified, rather than removed, so that it is appropriate for use in the other of the nFET region or the pFET region. In exemplary embodiments, the work function value of the base work function layer is modified by diffusing a work function altering element into the base work function layer.

A "work function" of a material is generally described as the energy, usually measured in electron volts (eV), needed to remove an electron from the Fermi level to a point immediately outside a solid surface of the material or the energy needed to move an electron from the Fermi level into a vacuum. Work function is a material property of any material, whether the material is a conductor, semiconductor, or dielectric. For a metal, the Fermi level lies within the conduction band, indicating that the band is filled with many freely moving electrons (based on Fermi statistics with respect to electron energy) as known to those skilled in the art. For an insulator, the Fermi level lies within the band gap, indicating an empty conduction band. For insulators, the minimum energy to remove an electron is about the sum of half the band gap and the electron affinity. For metal oxide semiconductor field effect transistor (MOSFET) devices, an effective work function for a metal on a dielectric structure is generally defined by the work function of the metal layer immediately adjacent to the dielectric of a metal-dielectric interface.

The work function of a material can be altered by diffusing an element into the material (sometimes referred to as "doping"). For example, undoped polysilicon has a work function of about 4.65 eV, whereas an exemplary polysilicon doped with boron (P-type) may have a work function of about 5.15 eV. The Fermi level of the boron doped polysilicon is close to the valence band of silicon, which may be referred to as "P-type" work function. Similarly, an N-type doped polysilicon may have a work-function of about 3.95 eV, which may be referred to as "N-type" work-function as the Fermi level is close to the conduction band of silicon. When a work function layer is used in a replacement metal gate stack, the work function layer can directly affect the threshold voltage of the transistor.

The work function layer used in replacement metal gate stacks, which is typically a metal nitride such as titanium nitride, is a parameter for setting the threshold voltage of a field effect transistor (FET), whether an nFET or pFET. In order to obtain a target electrical control of the FET devices, the work function layer used in replacement metal gate stacks should be P-type for a pFET and N-type for an nFET, and more particularly, about 5.2 eV or more and about 4.0 eV or less, respectively, for the pFET and nFET in the case of silicon.

Figure 1:
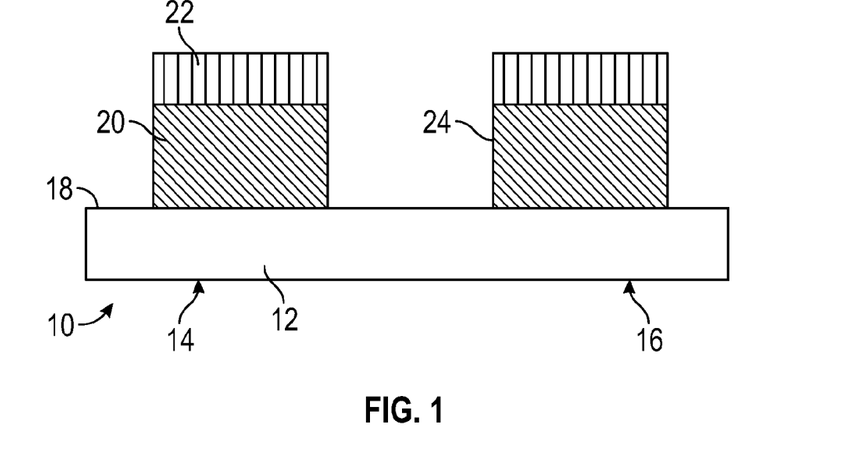
FIGS. 1-14 illustrate, in cross sectional views, portions of partially fabricated integrated circuits and methods for fabricating integrated circuits in accordance with various embodiments as described herein.

In FIG. 1, a partially fabricated integrated circuit 10 is shown that includes a substrate 12, where the substrate 12 includes semiconductor material. It is to be appreciated that various fabrication techniques may be conducted in accordance with the methods described herein to form the partially fabricated integrated circuit 10 as shown. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer. Also, the semiconductor substrate 12 may be planar or in the form of fin structures for use in a FinFET.

In exemplary embodiments, the semiconductor substrate 12 is provided with a first region 14 and a second region 16. The first region 14 is one of an nFET region or a pFET region and the second region 16 is the other of the nFET region or the pFET region. As described below, integrated circuit fabrication processes may differ for the first and second regions 14, 16 to form the appropriate replacement metal gate stacks for the pFET region or the nFET region. An nFET region is to include one or more nFETS and the pFET region is to include one or more pFETS. The nFET region may be formed with a P-type well region by doping the substrate 12 with "P" type conductivity imparting ions. The pFET region may be formed with an N-type well region by doping the substrate 12 with "N" type conductivity imparting ions. "N" type conductivity imparting ions primarily include ions of phosphorous, arsenic, and/or antimony, but other materials could also be used. "P" type conductivity imparting ions primarily include boron, aluminum, gallium, and indium, but other materials could also be used. Ion implantation may involve ionizing the conductivity imparting element (the dopant) and propelling the dopant ion into the substrate 12 under the influence of an electrical field. The substrate 12 may then be annealed to repair crystal damage from the ion implantation process, to electrically activate the dopants, and to redistribute the dopants within the semiconductor material. The annealing process can use widely varying temperatures, such as temperatures ranging from about 500 degrees centigrade (° C.) to about 1,200° C. The terms first and second region 14, 16 are used to generally describe two primary embodiments where the work function for nFETs are established first (nFET first embodiments), and also describe embodiments where the work function for the pFETs are established first (pFET first embodiments).

In the embodiment illustrated in FIG. 1 the substrate 12 is provided with a substantially planar substrate surface 18. One or more sacrificial gates 20 (sometimes referred to as dummy gates) are formed overlying the substrate surface 18. As referred to herein, the term "overlying" is used to encompass both "over" and "on", with features that "overlie" other features being disposed over and possibly directly upon the underlying features. In this regard, the overlying feature may directly contact the underlying feature or it may lie over the underlying feature such that another material layer is interposed between the overlying feature and the underlying feature. A sacrificial cap 22 may overlie the sacrificial gate 20 and serve as a hard mask for the sacrificial gate 20. The sacrificial gate 20 and sacrificial cap 22 can be fabricated using conventional processing techniques such as material deposition, photolithography, and etching. In one example, the material used for the sacrificial gate 20 is formed overlying the substrate surface 18, and then a hard mask material used for the sacrificial cap 22 is formed overlying the sacrificial gate material. In an exemplary embodiment, the sacrificial gate material includes a polycrystalline silicon material, and the hard mask material includes a silicon nitride material or a silicon oxide material, but other materials can be used in alternate embodiments. As referred to herein, a material or component that includes a recited element/compound includes the recited element/compound in an amount of at least 10 weight percent or more based on the total weight of the material or component unless otherwise indicated. In typical embodiments, the sacrificial gate materials and the sacrificial cap materials are sequentially blanket deposited on the substrate surface 18 in a conformal manner (using, for example, chemical vapor deposition (CVD), physical vapor deposition (PVD) or another suitable deposition technique). A resulting sacrificial cap material mask layer (not illustrated) is photolithographically patterned to form a sacrificial gate etch mask that serves as the sacrificial caps 22, and the underlying sacrificial gate material is anisotropically etched into the desired topology that is defined by the sacrificial caps 22. The resulting sacrificial gates 20 and sacrificial caps 22 include sacrificial gate side walls 24.

Figure 2:
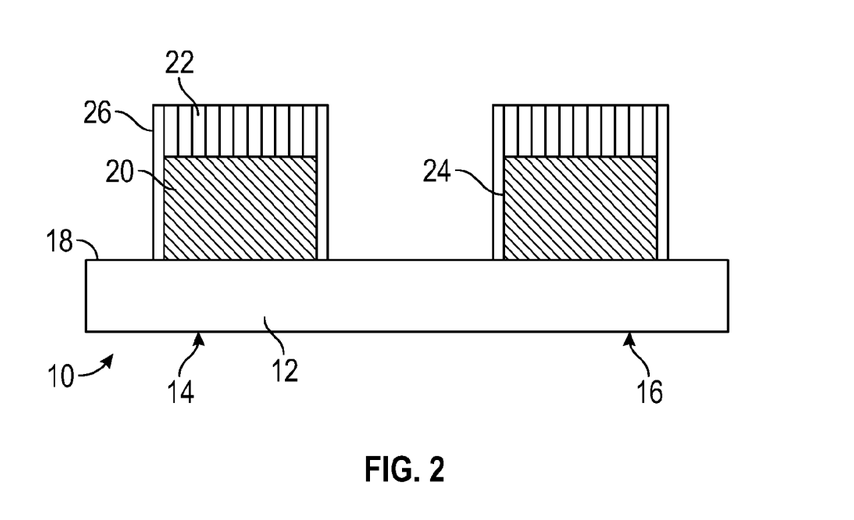

After the sacrificial gates 20 and sacrificial caps 22 have been formed, the process may continue by forming spacers 26 adjacent to the sacrificial gate side walls 24. In this regard, FIG. 2 depicts the state of the partially fabricated integrated circuit 10 after the formation of the spacers 26. The spacers 26 may be formed adjacent to and on the sacrificial gate side walls 24. In an exemplary embodiment, formation of the spacers 26 includes conformally depositing a spacer material overlying the sacrificial gate 20, the sacrificial cap 22, and the substrate surface 18 to form a spacer layer (not illustrated). The spacer layer includes an appropriate insulator, such as silicon nitride. The spacer material may be deposited by, for example, atomic layer deposition (ALD), chemical vapor deposition (CVD), low pressure chemical vapor deposition (LPCVD), semi-atmospheric chemical vapor deposition (SACVD), plasma enhanced chemical vapor deposition (PECVD), or other techniques. The spacer material is deposited to a thickness so that, after anisotropic etching, the spacers 26 have a thickness that is appropriate for the subsequent etching steps described below. Thereafter, the spacer layer is anisotropically and selectively etched to define the spacers 26. In practice, the spacer layer can be etched by, for example, reactive ion etching (RIE) using a suitable etching chemistry.

After the spacers 26 have been formed, other processing may be performed to form desired source/drain regions (not illustrated) in the substrate 12, such as trench etching in the substrate 12 and epitaxial deposition of source/drain material, stressing techniques, and ion implantations optionally using the sacrificial gates 20 as ion implantation masks. The fabrication process may proceed by forming dielectric areas 28 adjacent to and between the spacers 26, as illustrated in an exemplary embodiment in FIG. 3. At this point in an exemplary fabrication process, previously unoccupied space around the spacers 26 has been filled with the dielectric material of the dielectric areas 28, such as by blanket deposition.

Figure 3:
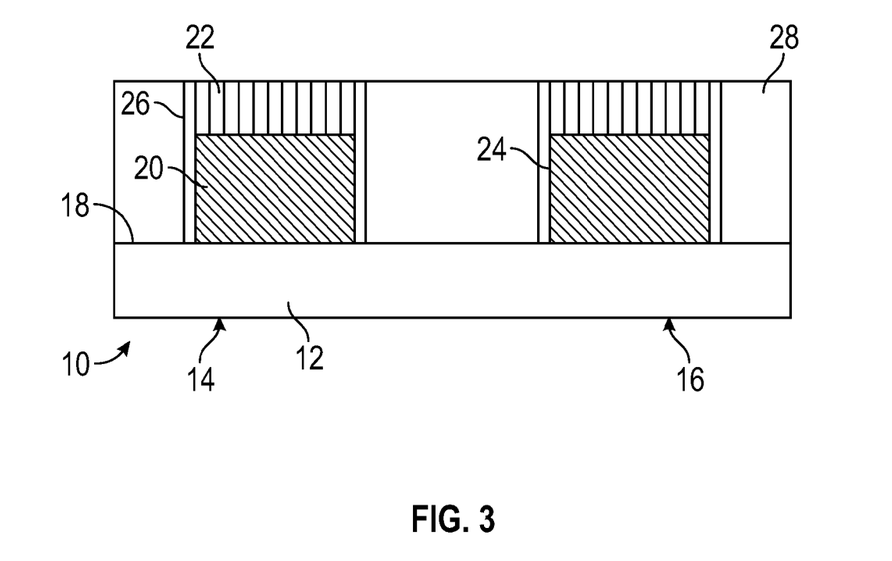

In certain embodiments, the dielectric areas 28 are formed from an interlayer dielectric (ILD) material that is initially blanket deposited overlying the substrate 12, the sacrificial gates 20 and sacrificial caps 22, and the spacers 26 using a technique such as CVD, LPCVD, or PECVD. The dielectric material is deposited such that it fills the spaces adjacent to the spacers 26 and such that it covers the spacers 26 and the sacrificial caps 22. Thereafter, the deposited dielectric material may be planarized using, for example, a chemical mechanical polishing (CMP) tool and such that the sacrificial caps 22 serve as a polish stop indicator to produce the dielectric areas 28.

Figure 4:
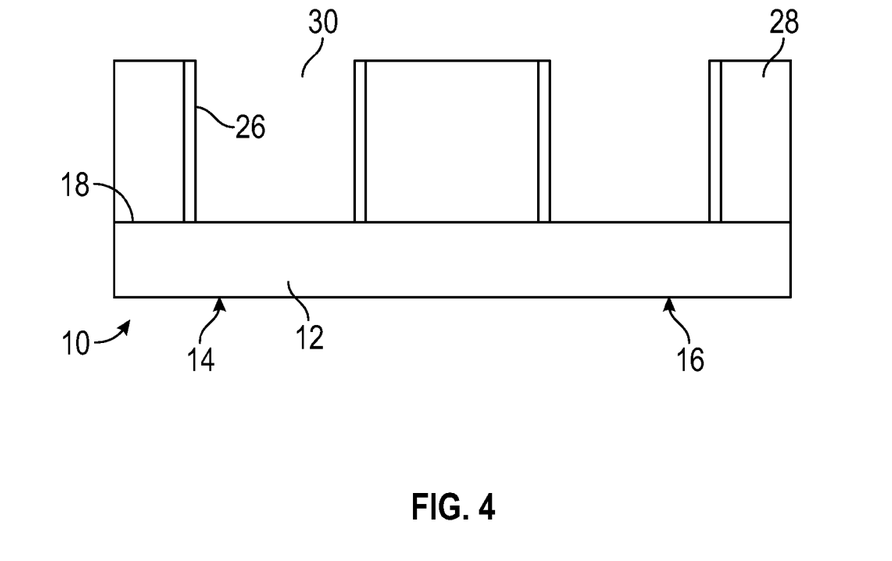

The exemplary fabrication process proceeds as illustrated in FIG. 4 by removing the sacrificial caps 22 and the sacrificial gates 20 while leaving the spacers 26 intact or at least substantially intact. Accordingly, removal of the sacrificial gates 20 exposes the substrate surface 18 between the spacers 26 in a trench 30 formed between adjacent spacers 26 and dielectric areas 28. As shown, the trenches 30 are defined by the spacers 26 and the substrate surface 18. In an exemplary embodiment, the sacrificial cap 22 and the sacrificial gate 20 are removed by sequentially or concurrently etching in a selective manner, and stopping at the desired point, such as a top surface of the substrate 12. The etching chemistry and technology used for this etching technique is chosen such that the spacers 26 and the dielectric areas 28 are not etched or are only etched by an insignificant amount. Etching of the sacrificial gates 20 may be controlled to stop at the substrate surface 18. The etching process may be a dry etch, such as a reactive ion etch, a wet etch, or a combination of the two.

Figure 5:
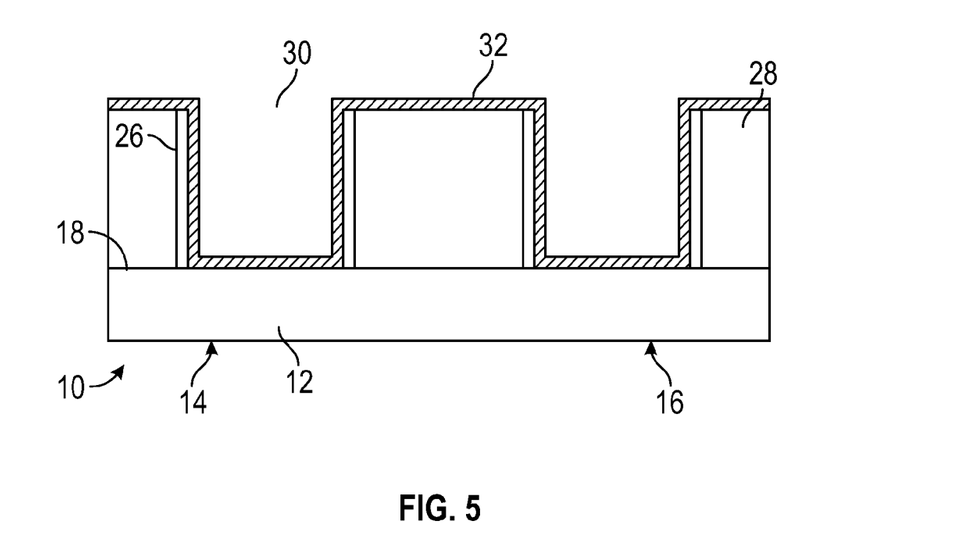

As illustrated in an exemplary embodiment in FIG. 5, a gate dielectric 32 is formed. In an exemplary embodiment, the gate dielectric 32 includes a high-k dielectric material that is conformally deposited over the partially fabricated integrated circuit 10. As used herein, "high k" denotes a dielectric material featuring a dielectric constant (k) higher than about 3.9. The gate dielectric 32 is formed over the first region 14 and the second region 16, adjacent to the spacers 26, overlying the substrate surface 18 within the trenches 30, and over the dielectric area 28 outside of the trenches 30. Exemplary high-k dielectric materials that may be included in the gate dielectric 32 include hafnium oxide ($HfO_2$), hafnium silicate ($HfSiO_x$), hafnium oxide silicate nitride ($HfO_xSi_yN_z$), aluminum oxide ($Al_2O_3$), titanium oxide ($TiO_2$), zirconium oxide ($ZrO_2$), lanthanum nitride (LaN) and lanthanum oxide ($La_2O_3$), although other high-k dielectric materials are also contemplated. In an exemplary embodiment, the gate dielectric 32 is formed by ALD. The gate dielectric 32 may have a thickness of from about 14 angstroms (Å) to about 18 Å, such as about 15 Å, but other thicknesses are also possible.

Figure 6:
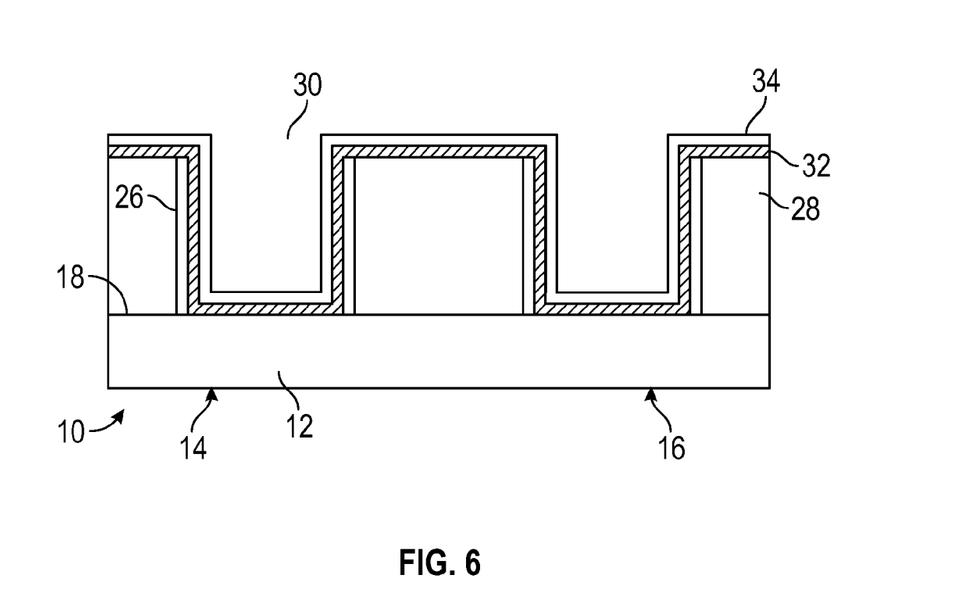

After formation of the gate dielectric 32, the exemplary method continues in FIG. 6 with formation of a bottom cap layer 34. The exemplary bottom cap layer 34 may be conformally formed over the gate dielectric 32, both within and outside of the trenches 30. An exemplary bottom cap layer 34 is formed from tungsten carbide or titanium nitride, although other suitable materials may be used. An exemplary process for forming the bottom cap layer 34 is ALD. An exemplary tungsten carbide bottom cap layer 34 may be formed with a thickness of from about 8 Å to about 15 Å, such as about 10 Å. An exemplary titanium nitride bottom cap layer 34 may be formed with a thickness of from about 5 Å to about 25 Å, such as about 10 Å. Other thicknesses are also possible in alternate embodiments. FIG. 6 illustrates the structure of the partially fabricated integrated circuit 10 after formation of the bottom cap layer 34.

FIGS. 7-14 illustrate exemplary embodiments of further processing for the partially fabricated integrated circuit 10 of FIG. 5 to form replacement metal gate stacks. A work function layer(s) for the pFET may be formed before the work function layer(s) for the nFET, or the work function layer(s) for the nFET may be formed before the work function layer(s) for the pFET in alternate embodiments, and the materials and techniques may vary for the different embodiments. The materials and techniques used in the processing of FIGS. 7-14 may differ depending on whether the work function layer for the nFET or for the pFET is formed first. Each embodiment will be discussed herein.

Figure 7:
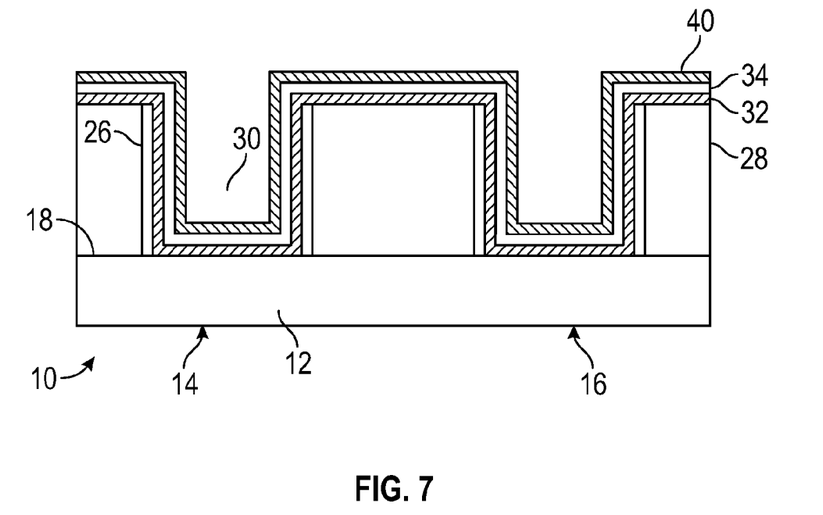

The exemplary fabrication process proceeds by forming a work function layer or a plurality of work function layers such that the replacement metal gate stacks have desired electrical characteristics. In FIG. 7, a base work function layer 40 is formed overlying the bottom cap layer 34. The base work function layer 40 may include a single work function material or a plurality of work function materials in various embodiments. An exemplary base work function layer 40 contains tungsten (W). When the work function for the pFET region is established first, an exemplary base work function layer 40 includes tungsten nitride, or be nitride rich. The work function of tungsten nitride may range from about 4.5 eV to about 5.0 eV and becomes larger (more P-type) with increased nitrogen content. Tungsten and nitrogen content can be controlled through the deposition process conditions as is well known. When the work function for the nFET region is established first, the exemplary base work function layer 40 may include tungsten carbide ($WC_x$), or be carbon rich. For tungsten carbide, the work function decreases (becomes more N-type) with increased carbon content, and the carbon content can be controlled through the deposition process. The work function for tungsten carbide may range from about 3.5 eV to about 4.0 eV. The base work function layer 40 may also include tungsten nitride carbide ($WN_yC_x$), where the concentration of the nitrogen and carbon are adjusted for a desired work function value that is appropriate for whichever of the nFET or pFET region is formed first, where the region formed first is the first region 14. The exemplary base work function layer 40 may be conformally formed over the bottom cap layer 34. In an exemplary embodiment, the base work function layer 40 is formed by ALD with a thickness of from about 5 Å to about 20 Å, such as about 10 Å. As illustrated, the base work function layer 40 is formed over both the first region 14 and the second region 16, so the base work function layer 40 overlies both the nFET region and the pFET region.

Figure 8:
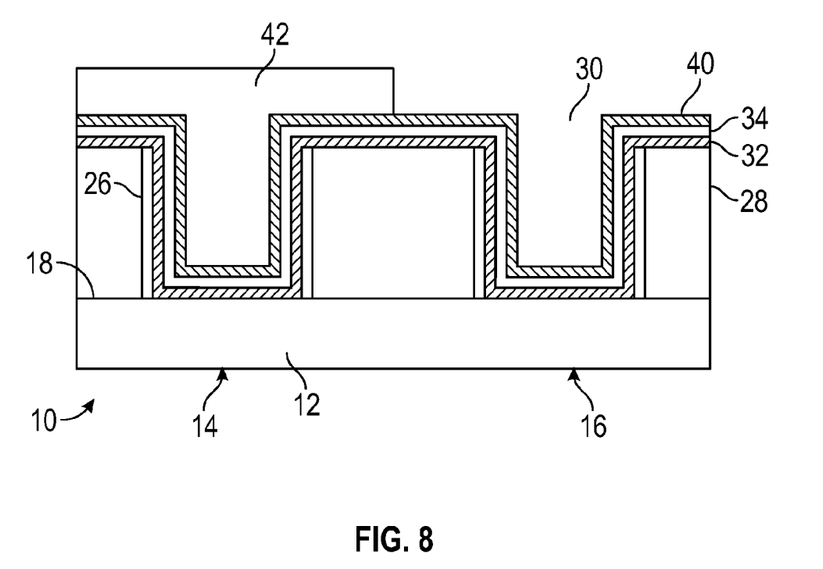

In an embodiment illustrated in FIG. 8, a mask 42 is formed and patterned to cover the first region 14 and expose the second region 16. In an exemplary embodiment, amorphous silicon may be deposited over the first and second regions 14, 16, and photoresist (not illustrated) may be deposited and processed conventionally to selectively remove the amorphous silicon from the second region 16 such that the mask 42 includes amorphous silicon. The photoresist may then be removed, such as with a wet strip or other known techniques. In FIG. 8, the second region 16 is exposed so that it may be chemically modified to change the work function value of the base work function layer 40 to an appropriate degree for the nFET or the pFET associated with the second region 16.

Figure 9:
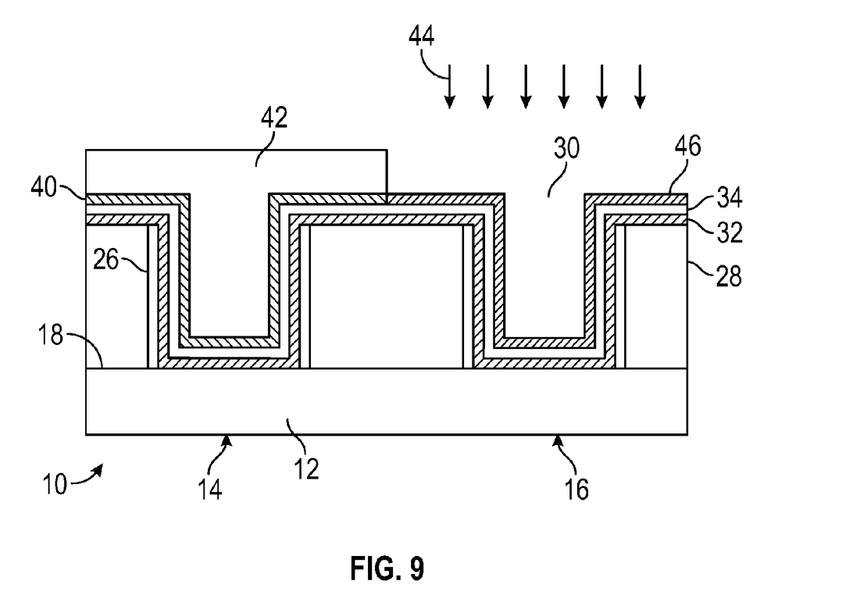
Figure 10:
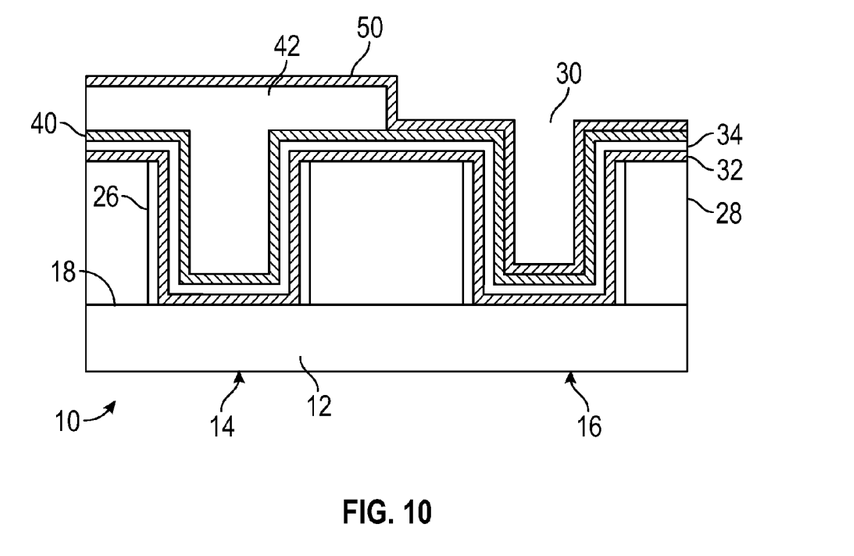

FIGS. 9 and 10 provide alternative exemplary methods for chemically modifying the base work function layer 40 overlying the second region 16. In many embodiments, a work function altering element is diffused into the base work function layer 40 overlying the second region 16 to change its work function value. In FIG. 9, an implantation process is performed to diffuse ions 44 by implantation into the exposed portion of the base work function layer 40 overlying the second region 16. The base work function layer 40 is transformed into a modified work function layer 46 when the work function altering element is diffused into the base work function layer 40, so the material that formed the base work function layer 40 remains and is a part of the modified work function layer 46. As shown, the ions 44 are implanted into the exposed portion of the base work function layer 40 overlying the second region 16 to form the modified work function layer 46 while the mask 42 inhibits implantation into the base work function layer 40 overlying the first region 14. In an exemplary process where the second region 16 is a pFET region, silicon ions may be implanted to form the modified work function layer 46, where the silicon ions are at a concentration of from about $1 \times 10^{12}$ to about $1 \times 10^{19}$ atoms/cm$^3$, but other concentrations are also possible. In this embodiment, silicon is the work function altering element. The work function value of the modified work function layer 46 can be controlled and tuned by controlling the concentration of silicon ions diffused into the modified work function layer 46. Tungsten nitride that includes silicon ions may have a work function value higher than the work function value of tungsten nitride that does not include silicon (i.e, more toward a P-type work function material), or that includes silicon at lower concentrations. The implantation may be performed with silicon ions at an energy of from about 0.1 kilo electron volts (KeV) to about 2 KeV or less, where these relatively low implantation energies may provide good control of the silicon on the surface of the work function layer. Alternatively, in embodiments where the second region 16 is a pFET, nitrogen may be diffused into the exposed modified work function layer 46 with a nitrogen plasma treatment or plasma assisted doping at an energy of from about 0.1 to about 2 KeV. The resulting nitrogen concentration may be from about $1 \times 10^{12}$ to about $1 \times 10^{19}$ atoms/cm$^3$. In another embodiment, the nitrogen atoms may be introduced into the base work function layer 40 by a nitrogen plasma treatment with a low bias voltage, such as about 100 volts or less, and an operating pressure of from about 10 to about 100 torr. After ion implantation or plasma treatment, the mask 42 may be removed.

Figure 11:
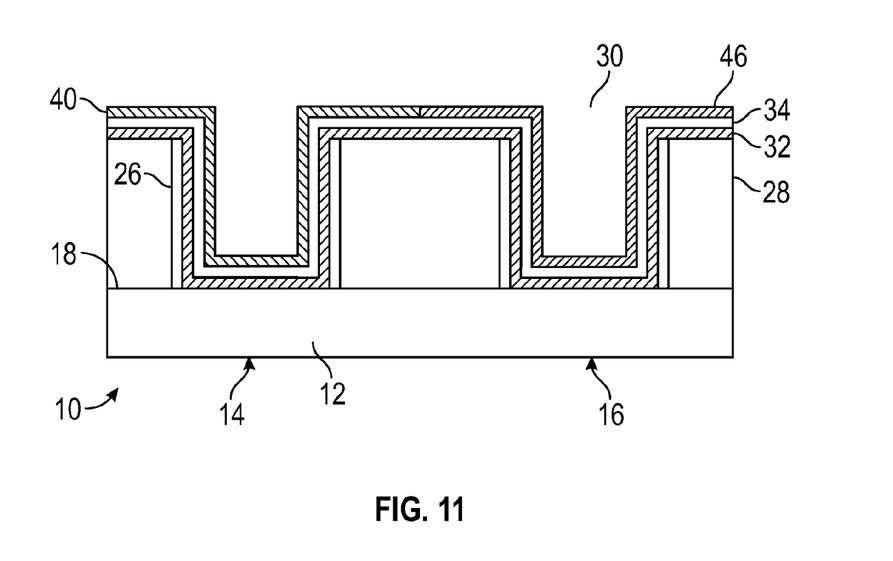

In other embodiments, the base work function layer 40 overlying the second region 16 may be modified by alternative techniques as illustrated in FIG. 10. In FIG. 10, a work function altering layer 50 is formed over the mask 42 and the exposed portion of the base work function layer 40 overlying the second region 16. The work function altering layer 50 includes one or more work function altering elements, and the work function altering elements are diffused into the base work function layer 40 overlying the second region 16 to form the modified work function layer 46, as illustrated in FIG. 11. The type and concentration of the work function altering element, and the degree of diffusion of the work function altering element into the modified work function layer 46, can be adjusted to tune the work function value of the modified work function layer 46. The remaining work function altering layer 50 and the mask 42 may be removed after the work function altering elements are diffused into the base work function layer 40. A wet strip or dry etching may be used in various embodiments. The work function altering element(s) can be diffused into the modified work function layer 46 with an anneal, and the parameters of the anneal may be adjusted based on the work function altering element(s), the desired concentration, the desired degree of diffusion, etc. The anneal may be performed at a wide variety of points in the manufacturing process, as described more fully below.

For an embodiment in which the second region 16 is a pFET region (i.e., the base work function layer 40 includes an N-type work function material such as tungsten carbide for an nFET first embodiment), an exemplary work function altering layer 50 to move towards a more P-type work function includes nickel, platinum, palladium, cobalt, or others as the work function altering element. In an exemplary embodiment, the work function altering layer 50 is deposited by PVD, metal organic chemical vapor deposition (MOCVD), or ion implantation at a thickness of from about 3 Å to about 25 Å, such a thickness of about 5 to about 10 Å. Nickel may be present in the work function altering layer 50 at a concentration of about 50 weight percent or more. As such, nickel may be present in the modified work function layer 46 at a concentration of from about 1 to about 5 weight percent, based on the total weight of the modified work function layer 46. The diffusion of nickel into a base work function layer 40 to form the modified work function layer 46 may raise the work function value (i.e., make the work function layer more P-type) from about 4.3 electron volts or less to a work function value of more than about 4.9 electron volts.

In embodiments where the second region 16 is an nFET region i.e., the base work function layer 40 includes a P-type work function material such as tungsten nitride for a pFET first embodiment), the work function altering layer 50 that moves more towards an N-type work function includes a work function altering element selected from one or more of indium (In), lanthanum (La), strontium (Sr), and aluminum (Al), such as one or more of indium, lanthanum, and strontium. In some embodiments, the dominant work function altering element is indium, and the indium may be present at a concentration of from about 50 weight percent or more in the work function altering layer 50, based on the total weight of the work function altering layer 50. As used herein, a "dominant work function altering element" is the work function altering element with the highest concentration in the modified work function layer 46. In alternate embodiments, lanthanum, strontium, or aluminum may be present in the work function altering layer 50 at concentrations of about 50 weight percent or more, based on the total weight of the work function altering layer 50. The work function altering layer 50 may have a thickness of from about 3 Å to about 25 Å, such a thickness of about from about 5 to about 10 Å, and may be formed by sputtering or other deposition techniques. The work function altering elements for an nFET (In, La, Sr, or Al) may be diffused into the base work function layer 40 that includes tungsten nitride. The diffusion of In, La, Sr, and/or Al into the base work function layer 40 to form the modified work function layer 46 may lower the work function value (i.e., make the work function value more N-type) from about 4.5 eV or more to a work function value of less than about 4.0 eV.

In some embodiments, P-type or N-type work function altering element ions may be incorporated into a base work function layer 40 that includes $WC_x$ or $WC_xN_y$ by sputter deposition. By properly controlling the sputter power and pressure (such as with a controlled ionization potential), some of the ions are incorporated into the base work function layer 40 or are incorporated at the interface or surface. Excess P-type or N-type metallic work function altering elements that form over the newly created modified work function layer 46 can be selectively etched away leaving the $WC_x$ or $WC_xN_y$ with either P-type or N-type work function metals incorporated therein. A laser based anneal can then be performed to re-distribute the diffused species either in the bulk or at the interface of the modified work function layer 46.

After forming the work function altering layer 50, an annealing process is performed to diffuse the work function altering element(s) into the modified work function layer 46, as illustrated in an exemplary embodiment in FIG. 11, with continuing reference to FIG. 10. The remaining work function alternating layer 50 and top cap layer 42 may be removed after the annealing that forms the work function altering layer 46, such as with a wet strip or dry etching, as mentioned above. The work function altering layer 50 may no longer be present in some embodiments because it has diffused into the modified work function layer 46. For example, the annealing process where indium is the work function altering element may include heating the partially fabricated integrated circuit to a temperature of from about 400° C. to about 900° C., such as about 900° C., for a duration of from about 0.1 milliseconds to about 10 seconds. An exemplary anneal process may be a flash anneal, spike anneal or laser based anneal. The annealing process causes diffusion of the work function altering element from the work function altering layer 50 into the modified work function layer 46 overlying the second region 16. As a result, the work function value of the modified work function layer 46 is changed such the modified work function layer 46 can be used with one of an nFET or a pFET, and the base work function layer 40 that remains overlying the first region 14 can be used with the other of the nFET or the pFET. In an exemplary embodiment, the modified work function layer 46 has a concentration of about 20 weight percent or more, such as from about 20 weight percent to about 80 weight percent of one or more of indium, lanthanum, strontium, or aluminum after the anneal, but the modified work function layer 46 may have a concentration of about 10 weight percent or greater or about 30 weight percent or greater of one or more of indium, lanthanum, strontium or aluminum after the anneal in alternate embodiments. The modified work function layer 46 also has a concentration of from about 20 to about 80 weight percent tungsten after the anneal.

Figure 12:
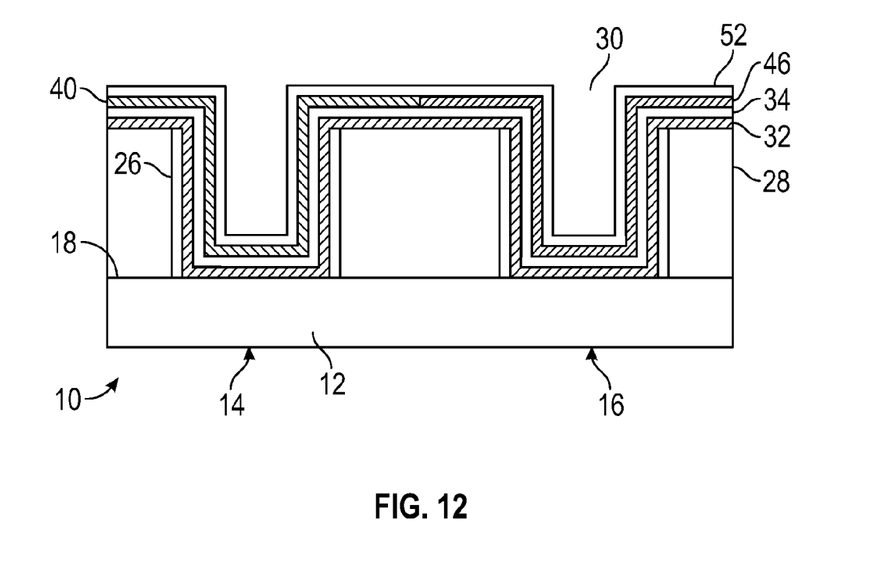

Reference is made to an exemplary embodiment illustrated in FIG. 12, with continuing reference to FIGS. 10 and 11. A top cap layer 52 may optionally be formed overlying the base work function layer 40 and the modified work function layer 46 in the first and second regions 14, 16. The top cap layer 52 may include titanium nitride, and may have a thickness of from about 5 Å to about 20 Å, such as about 10 Å. The top and bottom cap layers 52, 34 may help prevent the work function altering element(s) from migrating out of the area between the top and bottom cap layers 52, 34, so essentially all of the work function altering element(s) in the work function altering layer 50 may be diffused into the modified work function layer 46 overlying the second region 16. The integrated circuit 10 may then optional be cleaned, such as with a nitrogen trifluoride plasma treatment to remove undesired oxides.

The top cap layer 52, the modified work function layer 46, the base work function layer 40, and the bottom cap layer 34 may act as diffusion barriers that help reduce or eliminate aluminum or fluorine diffusion from the gate electrode 60 into the gate dielectric 32. The anneal that diffuses the work function altering element into the base work function layer 40 may be performed at almost any point of time after the work function altering layer 50 is formed, as long as enough heat is supplied to the work function altering layer 50 to diffuse the work function altering elements and form the modified work function layer 46.

Figure 13:
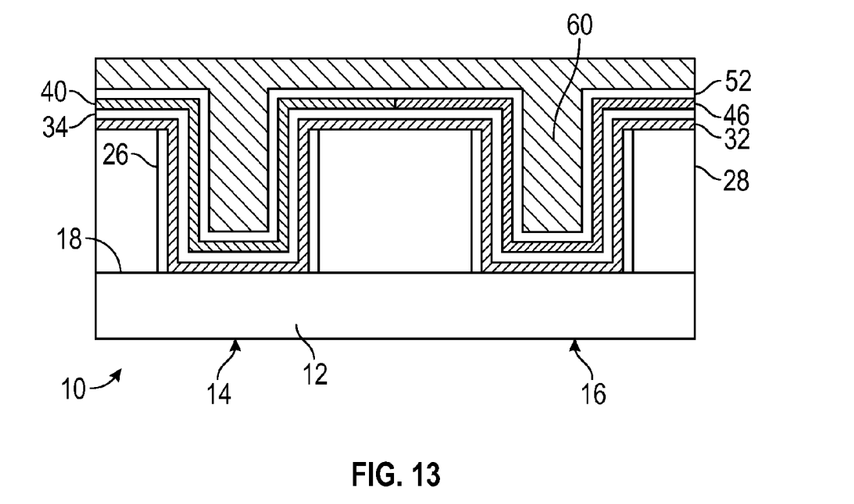

In FIG. 13, a gate electrode 60 is formed within the trench 30 and overlying the dielectric area 28. The gate electrode 60 is deposited to form a conductive core overlying the base work function layer 40 in the first region and the modified work function layer 46 in the second region. Several fill materials can be used for the gate electrode 60 as long as the fill materials are electrically conductive. As used herein, an "electrically insulating material" is a material with a resistivity of about $1 \times 10^4$ ohm meters or more, and an "electrically conductive material" is a material with a resistivity of about $1 \times 10^4$ ohm meters or less. Exemplary materials for the gate electrode 60 include tungsten, aluminum, cobalt, or copper. Low resistance tungsten may be used for the gate electrode 60 in some embodiments, where low resistance tungsten may be deposited by a CVD process. In other embodiments, the gate electrode 60 may be deposited by ALD, a nitrogen assisted CVD process, or another conformal process.

Figure 14:
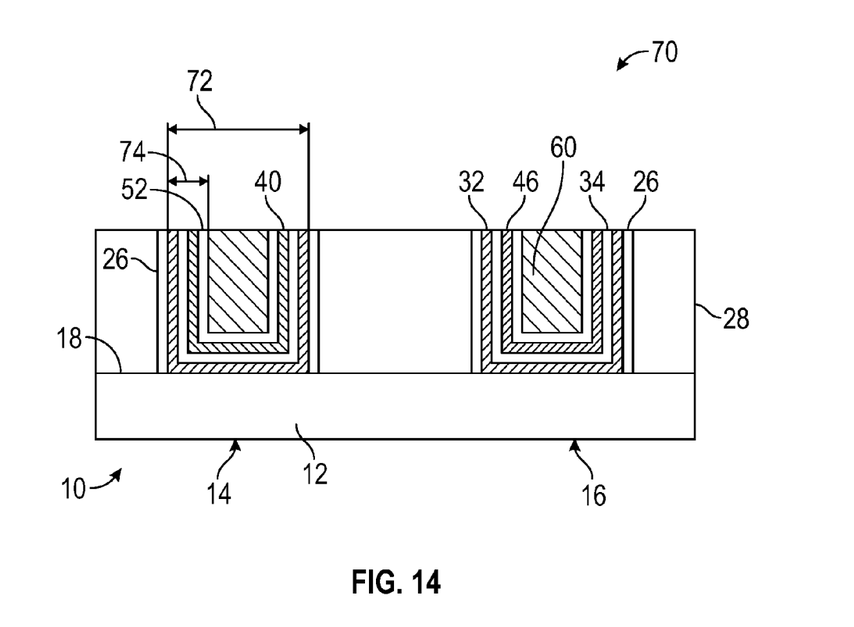

Overburden is removed in an exemplary embodiment illustrated in FIG. 14 to form the replacement metal gate stacks 70 over each of the first and second regions 14, 16. The overburden may be removed with a chemical mechanical planarization (CMP) process in some embodiments. The planarization process may remove portions of the gate dielectric 32, the bottom cap layer 34, the base work function layer 40 and the modified work function layer 46, the top cap layer 52, and the gate electrode 60 located over the top of trenches 30 and overlying the dielectric area 28. The replacement metal gate stacks 70 include the gate electrode 60, the top and bottom cap layers 34, 52, and the base work function layer 40 or the modified work function layer 46. As such, the replacement metal gate stacks 70 include all electrically conductive materials positioned between the spacers 26. The replacement metal gate stacks 70 have a gate length 72 measured from the gate dielectric 32 adjacent to one spacer 26 across the replacement metal gate stack 70 to the gate dielectric 32 adjacent to the next spacer 26. The gate length 72 may be from about 120 Å to about 300 Å, or about 240 Å or less in other embodiments. The top and bottom cap layers 52, 34 may have a combined thickness of about 20 Å, and the thickest of the base work function layer 40 or the modified work function layer 46 may have a thickness of about 15 Å. As such, the gate electrode 60 may have a thickness along the gate length 72 of from about 85 Å to about 265 Å, or a thickness along the gate length 72 of about 215 Å or less. A work function thickness 74, as measured from the gate dielectric 32 to the gate electrode 60, may be about 50 Å or less, or about 40 Å or less, or about 35 Å or less in various embodiments. As such, the gate electrode 60 may be thicker than in traditional FETs produced with thicker work function thicknesses 74. Therefore, the gate electrode 60 is less likely to form voids during producing and has a lower electrical resistance than traditional FETs of similar overall dimensions but with thicker work function thicknesses. Furthermore, the gate electrode 60 is about 50 Å or less, or about 40 Å or less, or about 35 Å or less in various embodiments from the gate dielectric 32.

After formation of the replacement metal gate stacks 70, further processing may be performed to complete the integrated circuit 10. For example and although not shown, back-end-of-line processing may involve the formation of gate caps, deposition of interlayer dielectric materials, formation of contacts, formation of interconnects between devices on the substrate 12, etc.

The integrated circuits 10 and methods for fabricating integrated circuits 10 described herein provide for replacement metal gate stacks 70 having improved threshold voltage uniformity, i.e., reduced threshold voltage variability, compared to more traditional replacement metal gate stacks (i.e., replacement metal gate stacks that do not include tungsten in the work function layers.) Specifically, conventional material deposition processes that increase threshold voltage variability, such as plasma treatment of titanium nitride, are avoided in accordance with the techniques described herein. Further, the methods described herein may exhibit a reduction in deposition processes (i.e., use of fewer layers), compared to more traditional replacement metal gate stacks. Also, the methods described herein avoid the removal of a work function layer from either the first or second region 14, 16, and instead modifies the work function layer in the second region 16 to allow for its use therein. Further, the materials used for the bottom and top cap layers 34, 52 and/or the base and modified work function layers 46, 40 may provide for better etch selectivities as compared to processing for more traditional replacement metal gate stacks. The materials used for the bottom and top cap layers 34, 52 and/or the base and modified work function layers 46, 40 may also be better diffusion barriers against aluminum and fluorine diffusion as compared to processing for more traditional replacement metal gate stacks.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating an integrated circuit comprising:
   forming a gate dielectric overlying a substrate;
   forming a base work function layer overlying the gate dielectric, wherein the base work function layer comprises tungsten, wherein the base work function layer overlies the gate dielectric in a first region and the base work function layer further overlies the gate dielectric in a second region, wherein the first region is one of a pFET region or an nFET region and the second region is the other of the pFET region and the nFET region;
   forming a mask overlying the first region;
   exposing the second region after forming the mask;
   altering a work function value of the base work function layer in the second region to produce a modified work function layer in the second region;
   removing the mask overlying the first region; and
   forming a gate electrode overlying the base work function layer and the modified work function layer.

2. The method of claim 1 wherein altering the work function value of the base work function layer comprises:
   forming a work function altering layer overlying the base work function layer in the second region, wherein the work function altering layer comprises a work function altering element; and
   diffusing the work function altering element into the base work function layer to produce the modified work function layer.

3. The method of claim 2 wherein forming the work function altering layer comprises forming the work function altering layer wherein the work function altering element is selected from the group consisting of indium, lanthanum, and strontium.

4. The method of claim 2 wherein forming the work function altering layer comprises forming the work function altering layer wherein the work function altering element is indium.

5. The method of claim 2 wherein diffusing the work function altering element into the modified work function layer lowers the work function value of the modified work function layer.

6. The method of claim 2 wherein diffusing the work function altering element into the base work function layer to form the modified work function layer comprises annealing the modified work function layer.

7. The method of claim 6 further comprising:
   forming a bottom cap layer underlying the base work function layer; and
   forming a top cap layer overlying the base work function layer prior to altering the work function value of the base work function layer in the second region to produce the modified work function layer.

8. The method of claim 7 wherein:
   forming the bottom cap layer comprises forming the bottom cap layer wherein the bottom cap layer comprises titanium nitride; and
   forming the top cap layer comprises forming the top cap layer wherein the top cap layer comprises titanium nitride.

9. The method of claim 1 wherein altering the work function value of the base work function layer comprises lowering the work function value of the base work function layer from about 4.5 electron volts or more to the work function value of less than about 4.0 electron volts.

10. The method of claim 1 wherein forming the gate electrode comprises forming the gate electrode wherein the gate electrode is spaced about 50 angstroms or less from the gate dielectric.

11. The method of claim 1 wherein altering the work function value comprises raising the work function value of the base work function layer.

12. The method of claim 1 wherein altering the work function value of the base work function layer comprises diffusing one or more of nickel or nitrogen into the base work function layer.

13. The method of claim 1 wherein forming the base work function layer comprises forming the base work function layer wherein the base work function layer comprises tungsten carbide.

14. The method of claim 1 further comprising:
   forming a top cap layer overlying base work function layer, wherein the gate electrode overlies the top cap layer, and wherein the top cap layer comprises titanium nitride.

15. The method of claim 1 wherein forming the base work function layer comprises forming the base work function layer comprising tungsten nitride.

16. The method of claim 1 wherein:
   forming the mask comprises forming the mask overlying the first region, wherein the first region is the pFET region; and exposing the base work function layer comprises exposing the base work function layer in the nFET region.

\* \* \* \* \*